(12) United States Patent
Beer et al.

(10) Patent No.: US 10,295,570 B2
(45) Date of Patent: May 21, 2019

(54) CURRENT SENSOR DEVICE HAVING A SENSE RESISTOR IN A RE-DISTRIBUTION LAYER

(71) Applicant: Infineon Technologies AG, Neubiberg (DE)

(72) Inventors: Gottfried Beer, Nittendorf (DE); Wolfgang Furtner, Fuerstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 530 days.

(21) Appl. No.: 14/837,048

(22) Filed: Aug. 27, 2015

(65) Prior Publication Data

US 2016/0084887 A1    Mar. 24, 2016

(30) Foreign Application Priority Data

Sep. 18, 2014   (DE) .................. 10 2014 113 498

(51) Int. Cl.
| | |
|---|---|
| *G01R 15/14* | (2006.01) |
| *G01R 19/00* | (2006.01) |
| *G01R 1/20* | (2006.01) |
| G01R 19/32 | (2006.01) |

(52) U.S. Cl.
CPC .......... *G01R 15/146* (2013.01); *G01R 1/203* (2013.01); *G01R 19/0092* (2013.01); *G01R 19/32* (2013.01); *H01L 2224/11* (2013.01)

(58) Field of Classification Search
CPC .................. G01R 15/146; G01R 19/0092; G01R 1/203; G01R 19/32; H01L 2224/11
See application file for complete search history.

(56) References Cited

U.S. PATENT DOCUMENTS

| | | | | |
|---|---|---|---|---|
| 2004/0128089 A1* | 7/2004 | Barsoukov | ......... | G01R 31/3662 702/65 |
| 2010/0201369 A1* | 8/2010 | Gronwald | .............. | G01R 1/203 324/430 |
| 2011/0291741 A1 | 12/2011 | Mayer et al. | | |
| 2013/0334662 A1* | 12/2013 | Jackson | ............. | G01R 19/0092 257/536 |

FOREIGN PATENT DOCUMENTS

| | | |
|---|---|---|
| DE | 100 42 839 | 4/2002 |
| DE | 10 2011 076 651 | 12/2011 |

* cited by examiner

*Primary Examiner* — Patrick Assouad
*Assistant Examiner* — Haidong Zhang
(74) *Attorney, Agent, or Firm* — Dicke, Billig & Czaja, PLLC

(57) ABSTRACT

The electronic device for sensing a current comprises a semiconductor chip comprising a main face, an electronic circuit integrated in the semiconductor chip, a redistribution metallization layer disposed above the main face of the semiconductor chip, a current path formed in the redistribution metallization layer, the current path forming a resistor that is connected at two resistance defining end points to the electronic circuit for sensing a current flowing through the current path, and external contact elements connected with the redistribution metallization layer for feeding a current to be sensed into the current path.

17 Claims, 7 Drawing Sheets

CURRENT SENSOR DEVICE HAVING A SENSE RESISTOR IN A RE-DISTRIBUTION LAYER

CROSS REFERENT TO RELATED APPLICATION

This Utility Patent Application claims priority to German Patent Application No. 102014113498.2, filed Sep. 18, 2014; and which is incorporated herein by reference.

TECHNICAL FIELD

The present disclosure relates to an electronic device and a current sensor device.

BACKGROUND

Several applications require determining the amount of current being supplied either to or from a device like, for example, a rechargeable battery. Power management applications, like e.g. battery charging, motor control, etc., require such current measurement with high precision. Often high precision discrete shunt resistors are employed for this purpose which is, however, a cost-intensive solution. For high precision current measurements temperature compensation is needed which requires additional components causing costs and lay out restrictions. On the other hand, wafer scale packaging and embedding technologies are now increasingly used so that also new possibilities of implementing shunt resistors are becoming more and more attractive.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1A:
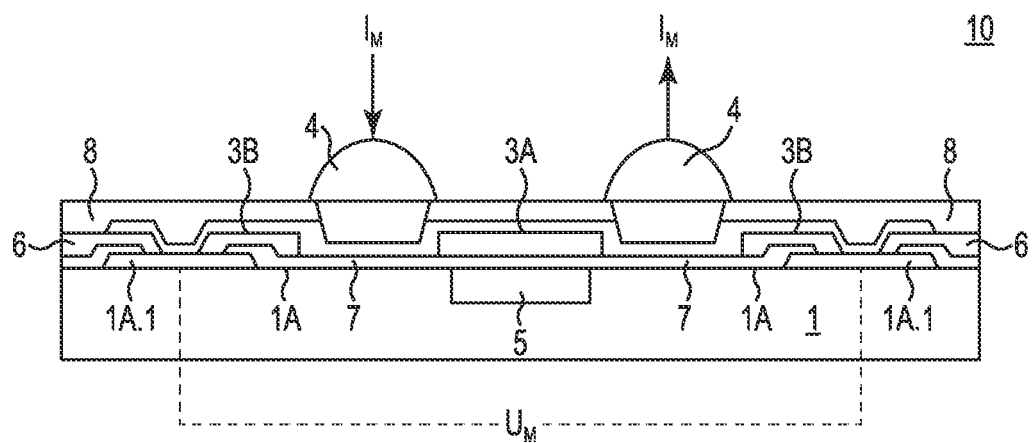
FIG. 1A,B shows a schematic cross-sectional side view representation (A) and a top view representation (B) of an exemplary electronic device according to the disclosure.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other instances, known structures and elements are shown in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of an embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of an electronic device and a method for fabricating an electronic device may use various types of semiconductor chips or electronic circuits incorporated in the semiconductor chips. The electronic device may comprise a semiconductor chip embedded in a package, i.e. embedded in an encapsulation material (encapsulant). The semiconductor chip may comprise electronic circuits performing all or part of the functions necessary for determining a voltage difference between contact pads and for calculating therefrom a current flowing through a shunt resistor, in particular a temperature sensor, one or more analog-to-digital converters, a microprocessor or microcontroller, one or more memories like, for example, non-volatile or volatile memories etc. Besides the foregoing the semiconductor chip may be configured in the form of an ASIC (application-specific integrated circuit) chip, the semiconductor chip may comprise battery management or battery control functionality, a motor control functionality etc. Among the circuits integrated in the semiconductor chip may be logic integrated circuits, analogue integrated circuits, mixed signal integrated circuits, sensor circuits, MEMS (Micro-Electro-Mechanical-Systems), switches, power integrated circuits, chips with integrated passives, etc. The semiconductor device may include additional components to form a System in Package (SiP).

In several examples layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, spin on, litho processing, printing etc.

The semiconductor chip may comprise contact elements or contact pads on one or more of their outer surfaces wherein the contact elements serve for electrically contacting the semiconductor chip. The contact elements may have any desired form or shape. They can, for example, have the form of lands, i.e. flat contact layers on an outer surface of the semiconductor package. The contact elements or contact pads may be made from any electrically conducting material, e.g. from a metal as aluminum, gold, or copper, for example, or a metal alloy, or an electrically conducting organic material, or an electrically conducting semiconductor material. The semiconductor device may comprise additional components like passive and/or active devices etc. The external contact elements may have any desired form or shape and may be of at least one of any solderable material, solder alloy, conductive material, material stack etc.

The contact elements of the semiconductor chip and/or semiconductor device may also comprise a diffusion barrier and/or adhesion layers. A thin WTi layer on the contact element may, for example, effect such a diffusion barrier.

In the claims and in the following description different examples of a method for fabricating an electronic device are described as a particular sequence of processes or measures, in particular in the flow diagrams. It is to be noted that the examples should not be limited to the particular sequence described. Particular ones or all of different processes or measures can also be conducted simultaneously or in any other useful and appropriate sequence.

Referring to FIG. 1A,B, there is shown a schematic cross-sectional side view representation (A) and top view representation (B) of an exemplary electronic device according to the disclosure. The electronic device 10 of FIG. 1A,B for sensing a current comprises a semiconductor chip 1 comprising a first main face 1A, an electronic circuit 2 integrated in the semiconductor chip 1, a redistribution metallization layer 3 disposed above the main face 1A of the semiconductor chip 1, a current path 3A formed in the redistribution metallization layer 3, the current path 3A forming a shunt resistor that is connected at two resistance defining end points to the electronic circuit 2 for sensing a current flowing through the current path, and external contact elements 4 connected with the redistribution metallization layer 3 for feeding a current to be sensed into the current path 3A.

The resistor is thus constructed by a direct connection of at least two external contact elements 4 on the redistribution layer 3 so that the resistor forms a low ohmic shunt connection. The external contact elements 4 can be formed as e.g. solder balls, solder lands or solder bumps. The current to be measured causes a voltage drop $U_M$ over this low ohmic shunt connection. By choosing the thickness of the redistribution layer 3 and the width, the length and/or shape of the current path 3A between the external contact elements 4, the resistor value can be dimensioned.

In the example of an electronic device 10 as shown in FIG. 1A,B, the semiconductor chip 1 comprises two contact pads 1A.1 disposed on the main face 1A, each one of the two contact pads 1A.1 being connected with one of the resistance defining end points. Furthermore in the example as shown in FIG. 1A,B the first main face 1A of the semiconductor chip 1 can be covered by a chip passivation layer 7 which comprises openings above the contact pads 1A.1. The contact pads 1A.1 can be connected with the electronic device 2 as shown by the dashed lines.

In the example of an electronic device 10 as shown in FIG. 1A,B, the two contact pads 1A.1 are disposed laterally displaced from the current path 3A or the external contact elements 4 and are connected with sense lines 3B with areas of the redistribution layer 3 located below the external contact elements 4. It may, however, also be the case that the two contact pads 1A.1 are disposed vertically below the current path 3A or the external contact elements 4.

In the example of an electronic device 10 as shown in FIG. 1A,B, the external contact elements 4 are disposed laterally inside of the semiconductor chip 1 boundaries. It can, however, also be the case that the external contact elements 4 are disposed laterally outside of the semiconductor chip 1 boundaries on a so-called fan-out area.

In the example of an electronic device 10 as shown in FIG. 1A,B, the electronic device 10 comprises two external contact elements 4. It can, however, also be the case the electronic device 10 comprises more than two external contact elements so that the current density at the joints between the external contact elements and the shunt resistor as well as between the external contact elements 4 and the motherboard might be reduced. According to an example thereof the electronic device 10 comprises an even or odd number of external contact elements. According to an example thereof one or more external contact elements are disposed above each one of opposing sides of the current path. According to a further example thereof the number of external contact elements at the opposite sides are identical or not identical.

In the example of an electronic device 10 as shown in FIG. 1A,B, the current path 3A is substantially rectangular in shape. It may, however, also be the case that the current path comprises another shape. The current path may, for example, be substantially formed of parallel lines.

Figure 2A:
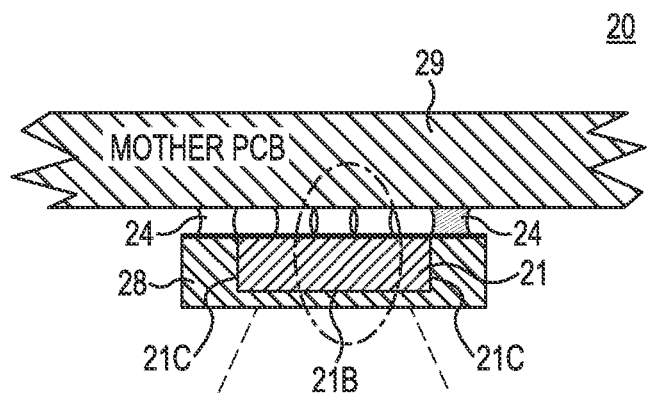
FIGS. 2A,B shows a schematic cross-sectional side view representation of an exemplary electronic device having a shunt layer disposed on a dielectric layer of the redistribution layer mounted to a PCB (A) and another schematic cross-sectional side view representation of the same electronic device in greater detail (B).

In the example of an electronic device 10 as shown in FIG. 1A,B, the semiconductor chip 1 is not embedded in embedded in an encapsulant or a substrate material. It may, however, also be the case that the semiconductor chip 1 is embedded in one of an encapsulant and a substrate material to form a fan-out area. According to an example thereof the semiconductor chip 1 comprises a first main face 1A, a second main face 1B opposite to the first main face 1A, and side faces 1C connecting the first and second main faces 1A and 1B, and as depicted in FIG. 2A the second main face 1B and the side faces 1C are covered by the encapsulation material or the substrate material, whereas the first main face 1A is not covered by the encapsulation material. In another embodiment the encapsulant may not cover the second main surface and/or may form a fan-out area only on one or more chip sides. In particular the first main face 1A is the active main face of the semiconductor chip 1 and the contact pads 1A.1 are disposed on the first main face. An example thereof will be shown further below with respect to FIG. 2A.

In the example of an electronic device 10 as shown in FIG. 1A,B, the external contact elements 4 are comprised of solder bumps or solder balls or solder lands. The external contact elements can also be comprised of solder lands or of solder elements comprising another appropriate shape.

In the example of an electronic device 10 as shown in FIG. 1A,B, a temperature sensor 5 is disposed in the semiconductor chip 1, in particular in such a way that it is integrated in the semiconductor chip 1 and furthermore in such a way that an upper surface of the temperature sensor 5 is adjacent to or coplanar with the first main face 1A of the semiconductor chip 1. The temperature sensor 5 can furthermore be located directly below the current path 3A so that it reliably measures the temperature of the current path 3A, i.e. the shunt resistor. According to an example thereof the temperature sensor 5 comprises a PTAT (Proportional To Absolute Temperature) temperature sensor.

In the example of an electronic device 10 as shown in FIG. 1A,B, the redistribution metallization layer 3 is disposed on an insulating dielectric layer 6. In this case the current path 3A is separated from the temperature sensor 5 by the dielectric layer 6 and the chip passivation layer 7. It may, however, also be the case that the dielectric layer 6 is omitted below the current path 3A so that the current path 3A is disposed directly on the chip passivation layer 7. It may furthermore be the case that the dielectric layer 6 and the chip passivation layer 7 are omitted below the current path 3A so that the current path 3A is disposed directly on the uppermost metal layer of the BEOL (back end of line) layer stack of the semiconductor chip 1. Examples thereof will be shown below.

According to an example of the electronic device 10 of FIG. 1A,B, the electronic circuit 2 is configured to determine the current flowing through the current path based on a potential difference sensed between the two resistance defining end points.

According to an example of the electronic device 10 of FIG. 1A,B, the electronic circuit 2 comprises a first analog-to-digital converter for inputting values of the electrical potential of the two resistance defining end points, a second analog-to-digital converter for inputting temperature values of the temperature sensor, a data processing unit for inputting output values of the first and second analog-to-digital converters, and a non-volatile memory for storing temperature dependent resistance value data.

According to an example of the electronic device 10 of FIG. 1A,B, the electronic circuit 10 further comprises besides the external contact elements 4 additional external contact elements for data transfer. These additional external contact elements can have the same shape as the external contact elements 4 or they can have a different shape.

According to an example of the electronic device 10 of FIG. 1A,B, the electronic device 10 is connected with the external contact elements 4 and, if necessary, also with the above-mentioned additional external contact elements, to a motherboard.

According to an example of the electronic device 10 of FIG. 1A,B, the semiconductor chip 1 comprises a logic circuit as, for example, one or more of an ASIC (application-specific integrated circuit), a battery monitor circuit, or a battery control circuit, or a motor control circuit.

Figure 6:
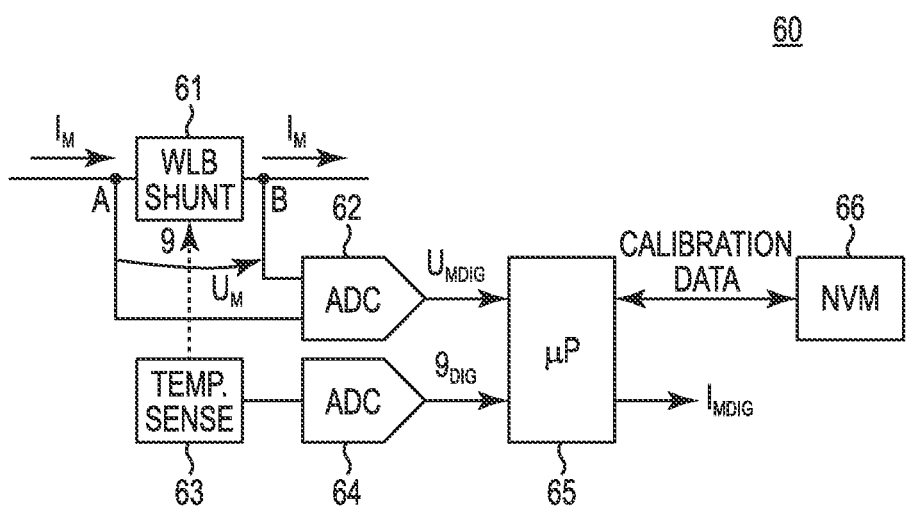
FIG. 6 shows a schematic circuit diagram for measuring the voltage difference and calculating the current according to the disclosure.

FIG. 6 shows a schematic circuit diagram for measuring the voltage difference and calculating the current according to the disclosure. The circuit 60 as shown in FIG. 6 is used to compute a digital representation $I_{MDIG}$ of a current $I_M$ flowing through the shunt 61. The current $I_M$ is supplied by means of the external contact elements 4 as shown in FIG. 1A,B. A potential difference $U_M$ is to be determined between resistance defining end points. For that purpose each one of contact pads A and B is connected with a first input of a first analog-to-digital (A/D) converter 62. An output of the first A/D converter 62 converts the analog potential difference into a digital representation $U_{MDIG}$ of the potential difference and delivers the digital value at an output thereof A temperature sensor 63 senses the temperature at the shunt 61 and supplies the analog temperature value to an input of a second A/D converter 64. The second A/D converter 64 converts the analog temperature value to a digital value $\delta_{DIG}$.

Figure 1B:
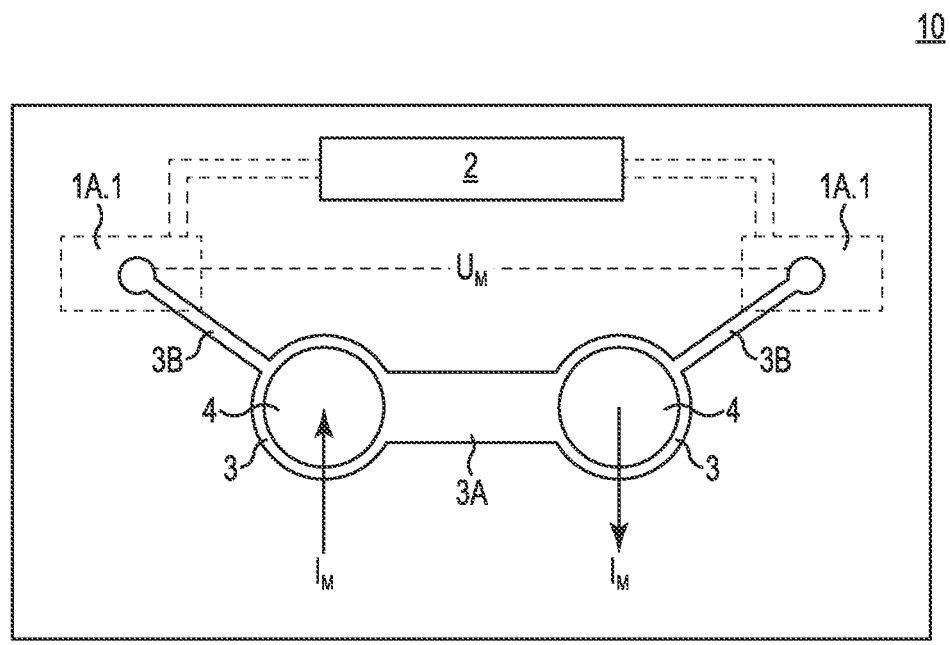

The outputs of the first and second A/D converters 62 and 64 are coupled each one with an input of a computation unit 65 which can be, for example, a microprocessor, a microcontroller, or an ASIC. The computation unit 65 is also connected with a non-volatile memory (NVM) 66 in which a functional relationship between temperature and resistance for the material of the shunt resistor 61 is stored which is in fact a temperature-resistance calibration curve. Each time when the computation unit 65 receives a digital voltage value $U_{MDIG}$ from the first A/D converter 62 and a digital temperature value $\delta_{DIG}$ from the second A/D converter 64, it calculates with the pre-stored calibration data from the NVM 66 and the values $U_{MDIG}$ and $\delta_{DIG}$ the actual shunt resistance for the particular shunt resistor 61. One or all of the devices 62 to 66 can be integrated in the semiconductor chip. Thus the circuit 60 as shown in FIG. 6 can either be identical with the electronic circuit 2 as shown in FIG. 1 or a part of the circuit 60 can be incorporated within or represented by the electronic circuit 2 and another part of the circuit 60 can be arranged elsewhere, i.e. outside of the electronic circuit 2 or of the semiconductor chip.

FIGS. 2A,B shows an exemplary electronic device having a shunt layer disposed on a dielectric layer of the redistribution layer in a schematic cross-sectional side view representation (A) and another schematic cross-sectional side view representation of the same electronic device in greater detail (B). The electronic device 20 as shown in FIG. 2A,B comprises a semiconductor chip 21 which is connected by external contact elements 24 to a motherboard 29. The external contact elements 24 are formed as solder balls. The semiconductor chip 21 comprises a temperature sensor 25 which is located at the upper first main face 21A of the semiconductor chip 21. In the example as shown in FIG. 2A,B, a BEOL (back end of line) layer stack 22 is disposed on the first main face 21A, the BEOL layer stack 22 comprising a metal layer 22A and a passivation layer 22B. On top of the BEOL layer stack 22 a redistribution layer (RDL) layer stack 23 is disposed, the RDL layer stack 23 comprising an (organic) dielectric layer 23A, a metal layer 23B, and a solder stop layer 23C. The shunt resistor is formed by the metal layer 23B so that in the example of FIG. 2A,B the shunt resistor is disposed directly on the dielectric layer 23A of the RDL layer stack 23. The electronic device 20 also comprises an encapsulant 28 which covers the second main face 21B and the side faces 21C of the semiconductor chip 21. In another embodiment the encapsulant covers only at least one side face 21C of the chip and the second main face 21B might be uncovered.

Figure 2B:
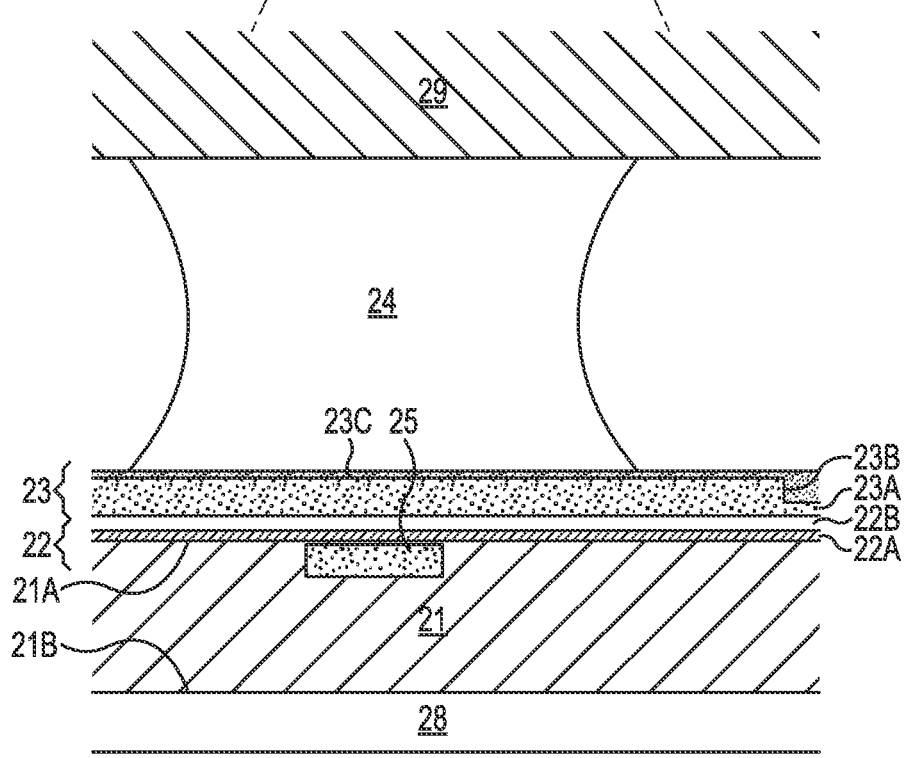
Figures 3A, 3B:
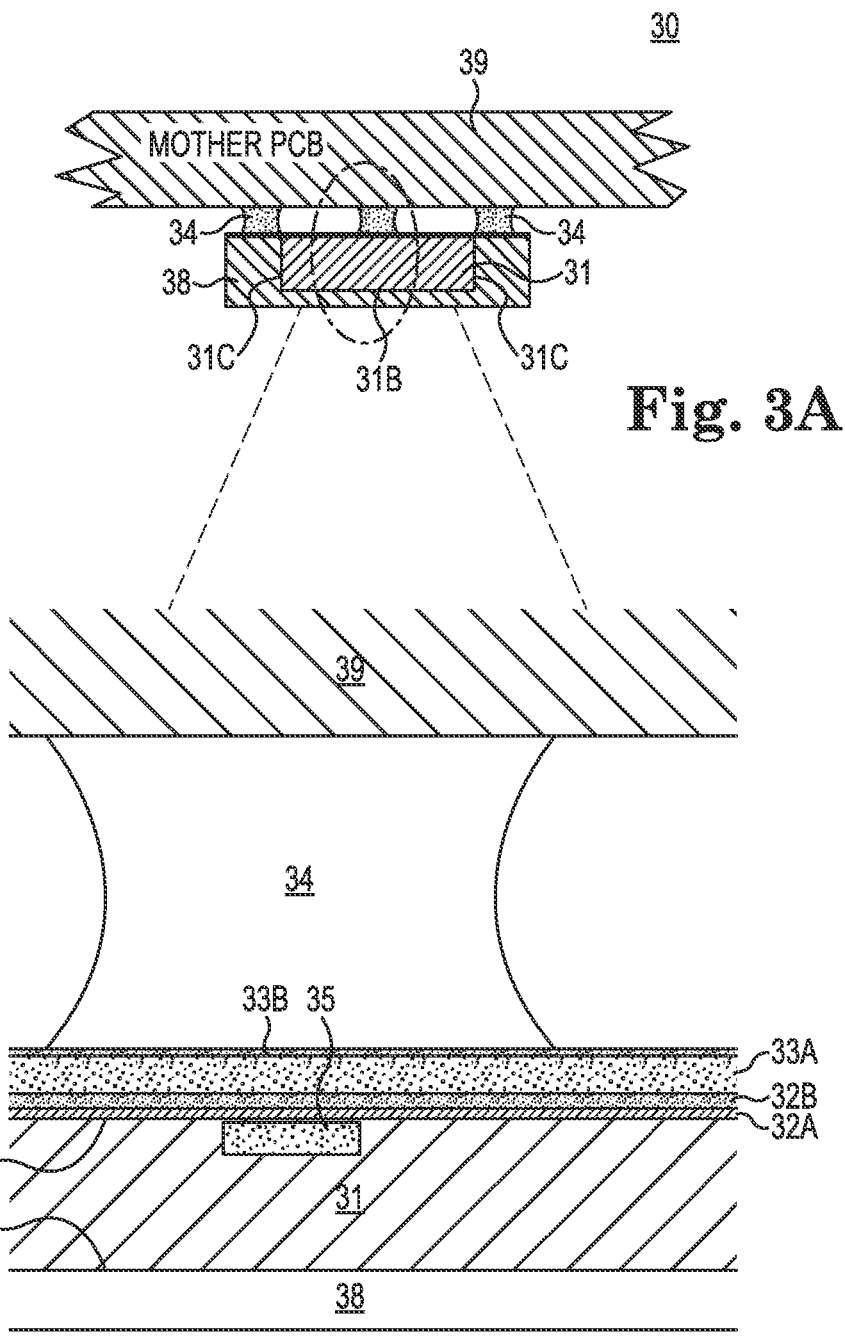
FIGS. 3A,B shows a schematic cross-sectional side view representation of an exemplary electronic device having a shunt layer disposed on a chip passivation layer (A) and another schematic cross-sectional side view representation of the same electronic device in greater detail (B).

FIGS. 3A,B shows an exemplary electronic device having a shunt layer disposed on a chip passivation layer in a schematic cross-sectional side view representation (A) and another schematic cross-sectional side view representation of the same electronic device in greater detail (B). The electronic device 30 as shown in FIG. 3A,B comprises a semiconductor chip 31 which is connected by external contact elements 34 to a motherboard. The external contact elements 34 are formed as solder balls. The semiconductor chip 31 comprises a (PTAT) temperature sensor 35 which is located at the upper first main face 31A of the semiconductor chip 31. In the example as shown in FIG. 3A,B, a BEOL (back end of line) layer stack 32 is disposed on the first main face 31A, the BEOL layer stack 32 comprising a metal layer 32A and a passivation layer 32B. On top of the BEOL layer stack 32 a redistribution layer (RDL) layer stack 33 is disposed, the RDL layer stack 33 comprising at this position a metal layer 33A and a solder stop layer 33B. The shunt resistor is formed by the metal layer 33A so that in the example of FIG. 3A,B the shunt resistor is disposed at least partially directly on the passivation layer 32B of the BEOL layer stack 32 resulting in a better thermal coupling to the temperature sensor 35 than the version depicted in FIG. 2. The electronic device 30 also comprises an encapsulant 38 which covers as here depicted the second main face 31B and the side faces 31C of the semiconductor chip 31.

Figure 4A:
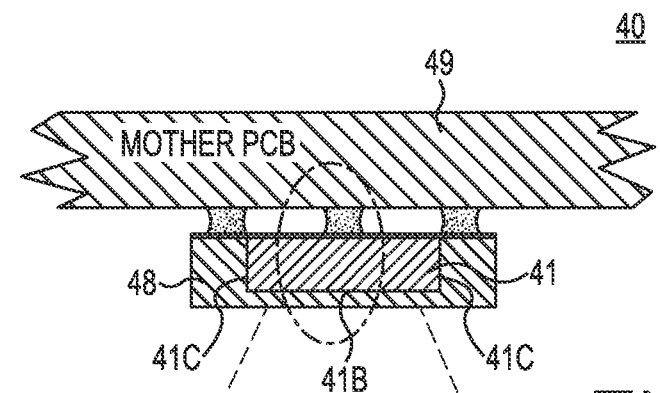
FIGS. 4A,B shows a schematic cross-sectional side view representation of an exemplary electronic device having a shunt layer disposed on an uppermost metal layer of the chip (A) and another schematic cross-sectional side view representation of the same electronic device in greater detail (B).
Figure 4B:
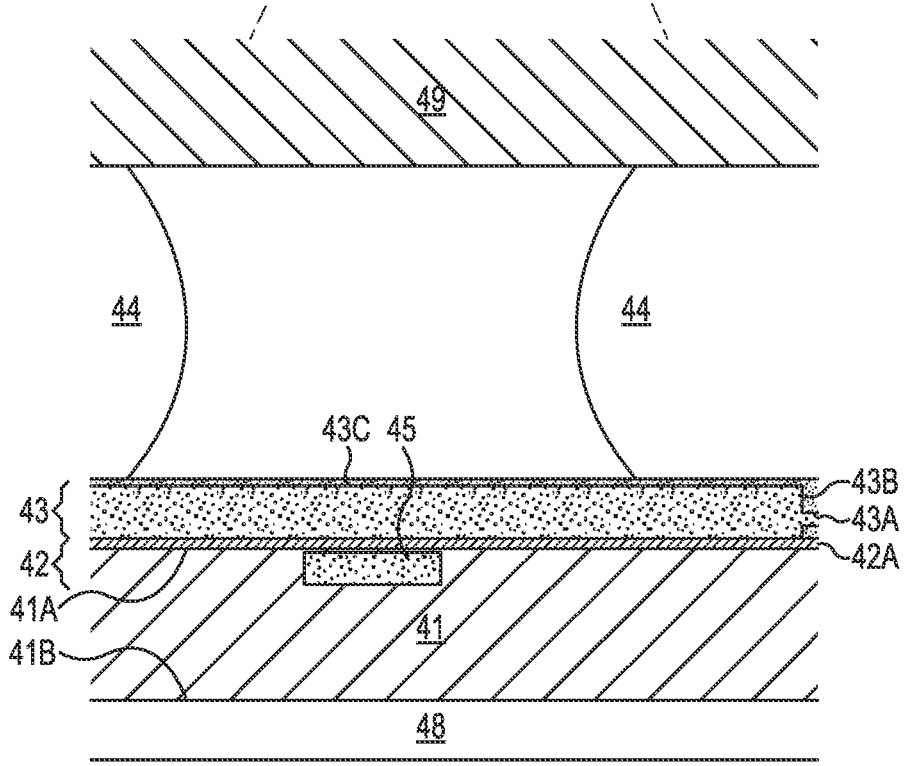

FIGS. 4A,B shows a schematic cross-sectional side view representation of an exemplary electronic device having a shunt layer disposed on an uppermost metal layer of the chip (A) and another schematic cross-sectional side view representation of the same electronic device in greater detail (B). The electronic device 40 as shown in FIG. 4A,B comprises a semiconductor chip 41 which is connected by external contact elements 44 to a motherboard. The external contact elements 44 are formed as solder balls. The semiconductor chip 41 comprises a temperature sensor 45 which is located at the upper first main face 41A of the semiconductor chip 41. In the example as shown in FIG. 4A,B, a BEOL (back end of line) layer stack 42 is disposed on the first main face 41A, the BEOL layer stack 42 comprising a metal layer 42A and a passivation layer which is not or only partially present in the area of the shunt resistor. On top of the BEOL layer stack 42 a redistribution layer (RDL) layer stack 43 is disposed, the RDL layer stack 43 comprising an (organic) dielectric layer 43A which is not or only partially present in the area of the shunt resistor. The shunt resistor is formed by the metal layer 43B so that in the example of FIG. 4A,B the shunt resistor is disposed at least partially directly on the metal layer 42A of the BEOL layer stack 42. The at least partial direct contact between metal layer 43B and metal layer 42A further improves the thermal coupling of the shunt resistor and the temperature sensor. Furthermore the shunt resistance might be reduced by parallel switching of both metal layers 42A and 43B. The electronic device 40 also comprises an encapsulant 48 which covers the second main face 41B and the side faces 41C of the semiconductor chip 41.

Figure 5A:
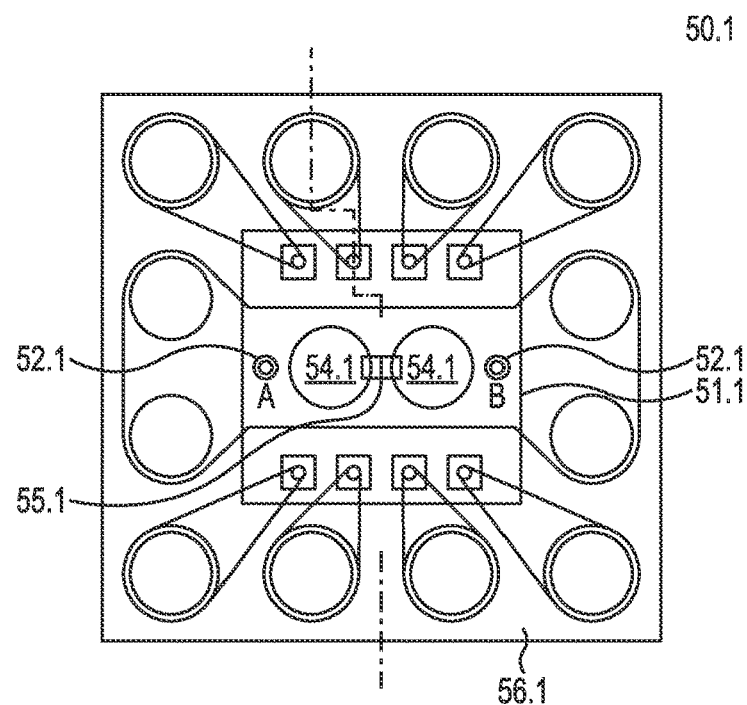
FIG. 5A,B,C shows a top view representation of an exemplary electronic device with a relatively large chip and sensor chip pads beneath the current path (A) and an exemplary electronic device with a relatively small chip and sensor chip pads connected by redistribution line to the current path (B).

FIG. 5A,B,C shows top view representations of exemplary electronic devices having different configurations.

FIG. 5A shows an electronic device 50.1 with a relatively large chip 51.1, a fan-out area 56.1 (here depicted on all chip sides), sensor chip pads 52.1 (A,B) beneath the shunt resistor defining the resistance end points, and external contact elements 54.1 which are formed as contact balls. The external contact elements 54.1 are disposed within the lateral boundaries of the semiconductor chip 51.1, preferably within the lateral boundaries of the shunt resistor. These contact elements 54.1 are not electrically coupled to the shunt resistor but designed to have an additional thermal path (thermal balls) between shunt resistor and motherboard improving heat dissipation. The temperature sensor 55.1 is disposed directly beneath the shunt resistor.

Figure 5B:
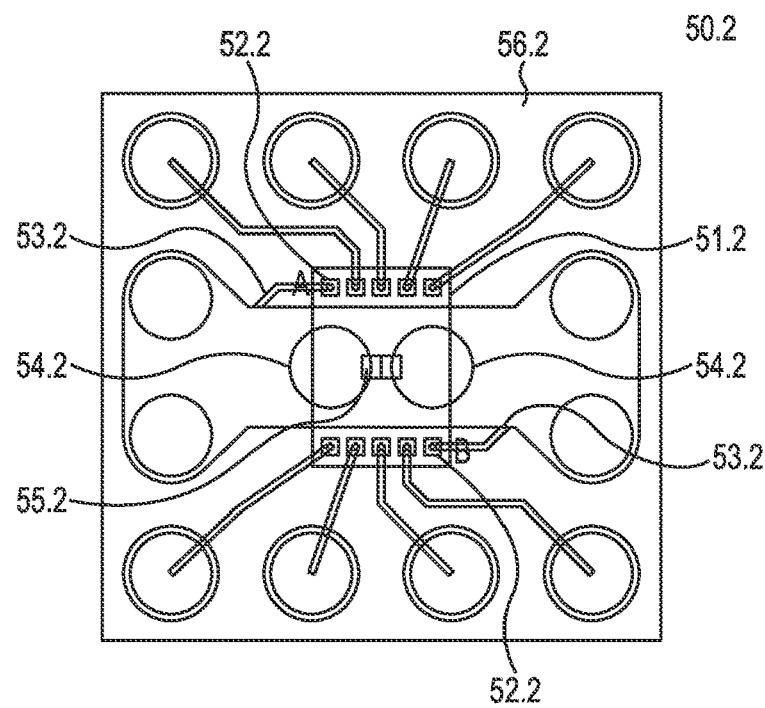

FIG. 5B shows an electronic device 50.2 with a relatively small chip 51.2, a fan-out area 56.2 and sensor chip pads 52.2 (A,B) connected to the resistance end points of the shunt resistor by redistribution line 53.2. The temperature sensor 55.2 is disposed directly beneath the shunt resistor. The depicted external connection elements 54.2 are thermal balls like described elements 54.1 in FIG. 5A.

Figure 5C:
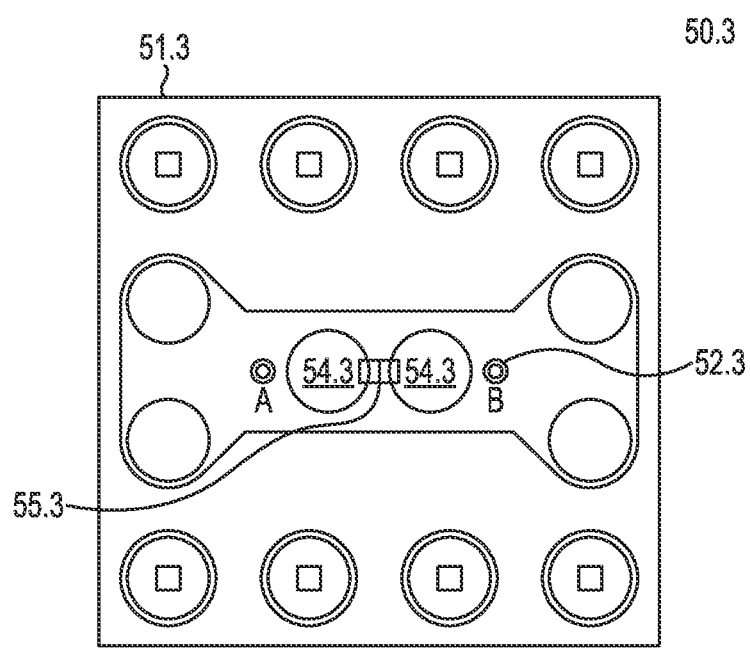

FIG. 5C shows an electronic device 50.3 with a relatively large chip 51.3 which has the same dimensions as the electronic device 50.3 so that in contrast to the embodiments of FIG. 5A,B there is no fan-out area. The chip 51.3 comprises sensor chip pads 52.3 (A,B) beneath the shunt resistor defining the resistance end points, and external contact elements 54.3 which are formed as contact balls. The temperature sensor 55.3 is disposed directly beneath the shunt resistor.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

What is claimed is:

1. An electronic device for sensing a current, comprising:
a semiconductor chip comprising a main face;
an electronic circuit integrated in the semiconductor chip, wherein the electronic circuit is connected with contact pads disposed on the main face of the semiconductor chip;
a redistribution metallization layer disposed above the main face of the semiconductor chip;
a current path formed in the redistribution metallization layer, the current path forming a resistor that is connected at two resistance defining end points;
external contact elements connected with the two resistance defining endpoints of the resistor for feeding a current to be sensed into the current path;
sense lines formed in the redistribution metallization layer and connected with the two resistance defining endpoints, each sense line connected between one of the two resistance defining endpoints and one of the contact pads that is connected with the electronic circuit, the electronic circuit sensing a current flowing through the current path.

2. The electronic device according to claim 1, wherein the contact pads connected with the sense lines are disposed vertically below the current path or the external contact elements.

3. The electronic device according to claim 1, wherein the contact pads connected with the sense lines are disposed laterally displaced below the current path or the external contact elements.

4. The electronic device according to claim 1, wherein the external contact elements are disposed laterally outside or inside of the semiconductor chip boundaries.

5. The electronic device according to claim 1, further comprising:
two or more external contact elements, wherein one or more external contact elements are disposed above each one of opposing sides of the current path.

6. The electronic device according to claim 5, wherein the number of external contact elements at the opposite sides are identical or not identical.

7. The electronic device according to claim 1, wherein the current path is substantially rectangular in shape.

8. The electronic device according to claim 1, wherein the current path is substantially formed of parallel lines.

9. The electronic device according to claim 1, wherein the semiconductor chip is embedded in one of an encapsulation material and a substrate material.

10. The electronic device according to claim 1, wherein the external contact elements are comprised of solder bumps, solder balls or solder lands.

11. The electronic device according to claim 1, further comprising:
a temperature sensor disposed in the semiconductor chip, in particular below the current path.

12. The electronic device according to claim 1, wherein the electronic circuit is configured to determine the current flowing through the current path based on a potential difference sensed between the two resistance defining end points.

13. The electronic device according to claim 12, wherein the electronic circuit comprises a first analog-to-digital converter for inputting values of the electrical potential of the two resistance defining end points, a second analog-to-digital converter for inputting temperature values of the temperature sensor, a data processing unit for inputting output values of the first and second analog-to-digital converters, and a non-volatile memory for storing temperature dependent resistance value data.

14. The electronic device according to claim 1, further comprising additional external contact elements for data transfer.

15. The electronic device according to claim 1, wherein the electronic device is connected with the external contact elements to a motherboard.

16. A current sensor device, comprising:
a semiconductor chip comprising a main face and contact pads disposed on the main face;
a redistribution metallization layer disposed above the main face of the chip and connected to at least two of the contact pads;
at least two external contact elements disposed above the redistribution metallization layer;
a current path connected with the at least two external contact elements, the current path being integral to said redistribution metallization layer, the current path comprising two end points, each one of the two end points being connected through the redistribution metallization layer with at least one of the at least two of the contact pads; and
an electronic circuit integrated in the semiconductor chip and connected with the at least two of the contact pads that are connected with the two end points, the electronic circuit sensing a current flowing through the current path,.

17. A current sensor device, comprising:
a substrate;
contact pads disposed on a main face of the substrate;
a redistribution layer disposed above the main face of the substrate and connected with at least two of the contact pads;
at least two external contact elements disposed above the redistribution layer;
a shunt line connecting the at least two external contact elements and being formed in the redistribution layer;
two sense lines, each one of the two sense lines formed in the redistribution layer and connecting one of the at least two of the contact pads with one of two end points of the shunt line; and
an electronic circuit integrated in the substrate and connected with the at least two of the contact pads connected with the two sense lines, the electronic circuit sensing a current flowing through the shunt line.

* * * * *